(12) United States Patent
Chung

(10) Patent No.: US 7,662,691 B2
(45) Date of Patent: Feb. 16, 2010

(54) METHOD FOR FABRICATING SEMICONDUCTOR DEVICE WITH EPITAXIAL GROWTH

(75) Inventor: Su Ock Chung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 53 days.

(21) Appl. No.: 11/872,023

(22) Filed: Oct. 14, 2007

(65) Prior Publication Data
US 2008/0290402 A1 Nov. 27, 2008

(30) Foreign Application Priority Data
May 25, 2007 (KR) .................. 10-2007-0050788

(51) Int. Cl.
*H01L 21/336* (2006.01)
(52) U.S. Cl. .................. 438/294; 257/E21.409
(58) Field of Classification Search .................. 438/296, 438/294, 197; 257/327, E29.245, E21.409
See application file for complete search history.

(56) References Cited

U.S. PATENT DOCUMENTS

| 7,166,514 | B2* | 1/2007 | Kang et al. ............... 438/296 |
| 2006/0131657 | A1* | 6/2006 | Hamaguchi ............... 257/369 |
| 2006/0220131 | A1* | 10/2006 | Kinoshita et al. .......... 257/347 |
| 2007/0212874 | A1* | 9/2007 | Sandhu ...................... 438/637 |

* cited by examiner

*Primary Examiner*—Matthew Smith
*Assistant Examiner*—Michele Fan
(74) *Attorney, Agent, or Firm*—Townsend and Townsend and Crew LLP

(57) ABSTRACT

A semiconductor device comprises an active region including a first active area to be a source/drain and a second active area to be a gate, and a device isolation region defining the active region. The first active area is obtained by growing a semiconductor substrate located between the gates as a seed layer, and formed to have a larger line-width than that of the second active area in a longitudinal direction of the gate.

12 Claims, 8 Drawing Sheets

METHOD FOR FABRICATING SEMICONDUCTOR DEVICE WITH EPITAXIAL GROWTH

CROSS-REFERENCES TO RELATED APPLICATIONS

The priority of Korean patent application number 10-2007-0050788, filed on May 25, 2007, which is incorporated by reference in its entirety, is claimed.

BACKGROUND OF THE INVENTION

The present invention generally relates to a semiconductor device. More particularly, the present invention relates to a semiconductor comprising a fin-transistor and a method for fabricating the same.

In a fin-channel-array-transistor ("FCAT"), a channel width of fin channel transistors is determined by a short width of an active region mask. That is, since a width of a gate is equal to the short width of the active region mask in a semiconductor device [e.g., Dynamic Random Access Memory ("DRAM")], the fin channel transistor should not be smaller than a length between source/drains adjacent to a channel width. The fin channel transistor can reduce the short channel effects ("SCE") as the channel width becomes smaller, by increasing the effective channel width. However, there is a limit to how much the channel width of the fin channel transistor can be reduced because it is necessary to secure an area for the source/drain contact regions.

Since a recess gate mask for forming a fin channel transistor has a line/space type pattern, a gate electrode formed over a device isolation structure is separated from a storage node junction region by a gate insulating film, thereby increasing a parasitic capacitance of the gate electrode. The parasitic capacitance of the gate electrode degrades the operation speed of the cell transistor. Also, leakage current is increased in the storage node junction region due to a gate induced drain leakage ("GIDL") effect, thereby degrading refresh characteristics of the DRAM.

BRIEF SUMMARY OF THE INVENTION

Embodiments of the invention are directed to a fin gate in a semiconductor device. According to one embodiment, the fin gate is formed in a fin-type active region of a semiconductor device where the line width is smaller than the width of source/drains, thereby reducing short channel effects.

According to one embodiment, a semiconductor device comprises an active region including a first active area to be a source/drain and a second active area to be a gate, and a device isolation region defining the active region. The second active area is formed as a portion of a fin gate, and the first active area is formed growing a semiconductor substrate between the neighboring gates as a seed layer. In a longitudinal direction of the gate, a line width of the first active area is greater than the width of the second active area.

According to another embodiment, a method for fabricating a semiconductor device comprises: forming a device isolation structure over a semiconductor substrate to define an active region including a first active area and a second active area, wherein the second active area is formed as a portion of a fin gate, and the first active region is formed growing the semiconductor substrate between two neighboring gates as a seed layer, wherein a line width of the first active region is greater than the width of the second active region; etching a portion of the device isolation structure overlapping the gate by using a recess mask to form a recess; and forming the fin gate including a gate conductive layer to fill the recess.

In one embodiment, a method of fabricating a semiconductor device having a fin gate includes forming first and second trenches on a semiconductor substrate to define a protruding portion between the first and second trenches; etching a portion of the protruding portion to define first, second, and third recesses, the first recess being adjacent to the first trench, the second recess being adjacent to the second trench, the third recess being defined between the first and second recesses; and performing a selective epitaxial process on the semiconductor substrate to grow semiconductor material at the first, second, and third recess to form a first active region.

In another embodiment, the method further includes forming a first insulation layer within the first and second trenches, the first insulation layer having an upper surface that is provided below an upper surface of the protruding portion. The semiconductor material grown by the epitaxial process extends partly over the first insulation layer provided at the first and second trenches. The protruding portion is used to define the fin gate.

DESCRIPTION OF EMBODIMENTS

Figure 1:
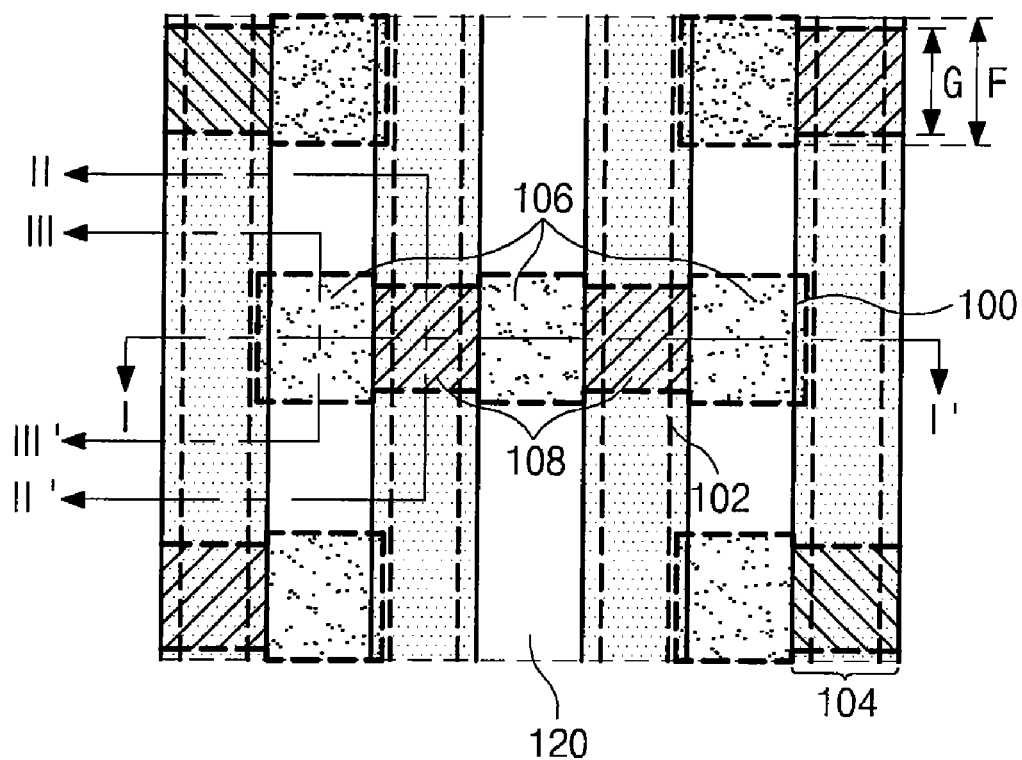
FIG. 1 is a layout illustrating a semiconductor device according to an embodiment of the invention.
Figure 5:
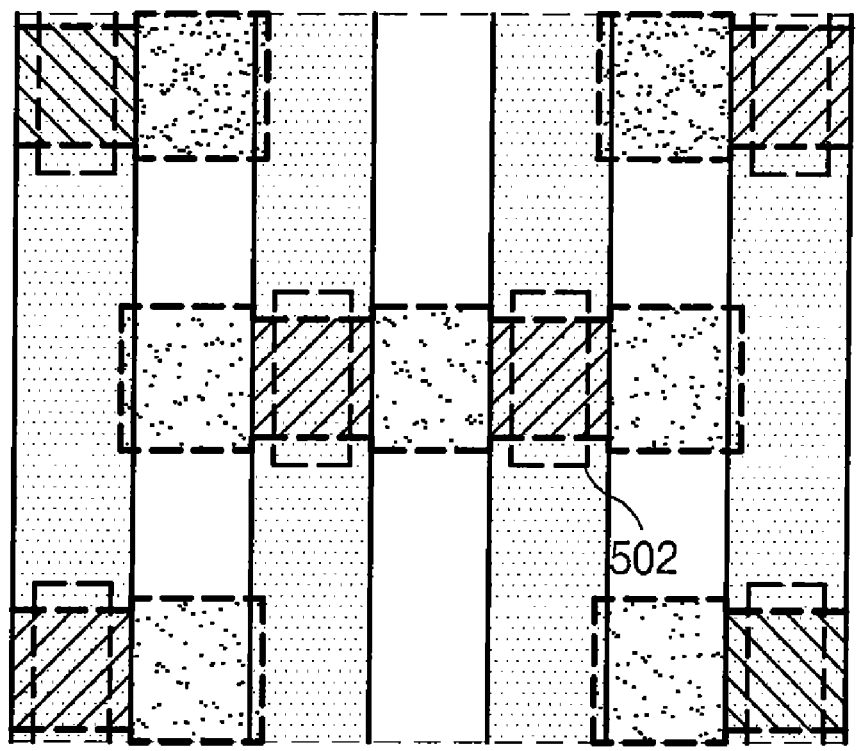
FIG. 5 is a layout illustrating a semiconductor device according to another embodiment of the invention.

FIG. 1 is a layout illustrating a semiconductor device according to an embodiment of the invention. The semiconductor device comprises of an active region 100 defined by a device isolation region 120, a fin gate region 102, and a gate region 104. A fin transistor is formed in fin gate region 102. Active region 100 includes a first active region 106 that is to become source/drains and a second active region 108 overlapping with a gate region 104. A longitudinal direction of gate region 104 is defined as a "vertical direction", and a longitudinal direction of active region 100 is defined as a "horizontal direction". Fin gate region 102 is formed in a line type, and overlaps with second active region 108. In the vertical direction, the line width of first active region 106 is F, and the line width of second region 108 is G (where 7F/20<G<19F/20 and F is a distance between the neighboring two gate regions). Gate region 102 is not limited to a line type. In another embodiment of the invention, a fin gate region 502 as shown in FIG. 5 is formed in an island type.

Figure 2:
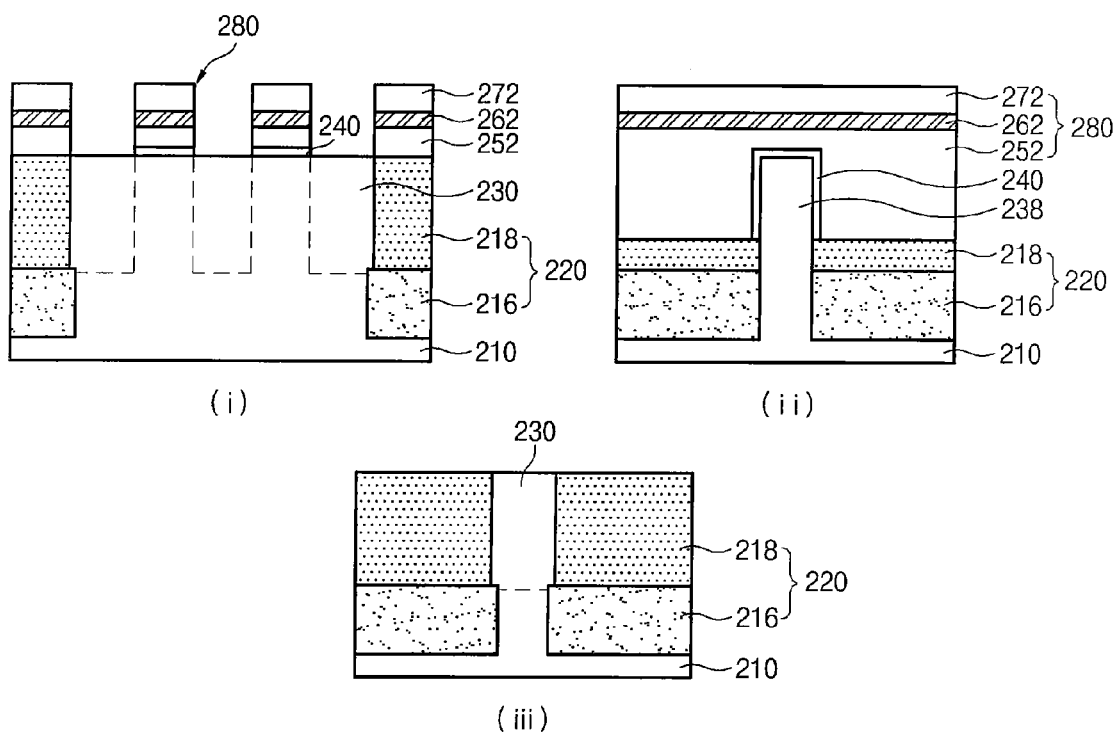
FIG. 2 is a cross-sectional view illustrating a semiconductor device according to an embodiment of the invention.

FIG. 2 is a cross-sectional view illustrating a semiconductor device according to an embodiment of the invention. FIG. 2 (i) is a cross-sectional view taken along I-I' of FIG. 1. FIG. 2 (ii) is a cross-sectional view taken along II-II' of FIG. 1. FIG. 2 (iii) is a cross-sectional view taken along III-III' of FIG. 1. The semiconductor device comprises a device isolation structure 220, a silicon epitaxial growth layer 230, a fin-type active region 238, and a fin gate structure 280. Device isolation structure 220 defines an active region including silicon epitaxial growth layer 230. Fin gate structure 280 is disposed over fin-type active region 238.

A portion of a semiconductor substrate 210 of a first active region 106 of FIG. 1 is selectively etched. A thermal treatment process is performed on the selectively etched semiconductor substrate 210 as a seed layer, to form silicon epitaxial growth layer 230. A depth of the etched semiconductor substrate 210 is in a range of about 10 nm to 100 nm. The thermal treatment process is performed under a $H_2$ atmosphere at a temperature in a range of about 500° C. to 1,000° C. A plasma cleaning process including $SF_6/H_2$ is performed on the etched semiconductor substrate 210. The plasma cleaning process and the thermal treatment process are performed by an in-situ method.

Device isolation structure 220 is formed to have a stacked structure having a first device isolation insulating film 216 and a second device isolation insulating film 218. Fin gate structure 280 is formed to have a stacked structure having a lower gate electrode 252, an upper gate electrode 262, and a gate hard mask layer 272 over a gate insulating film 240.

Figure 3A:
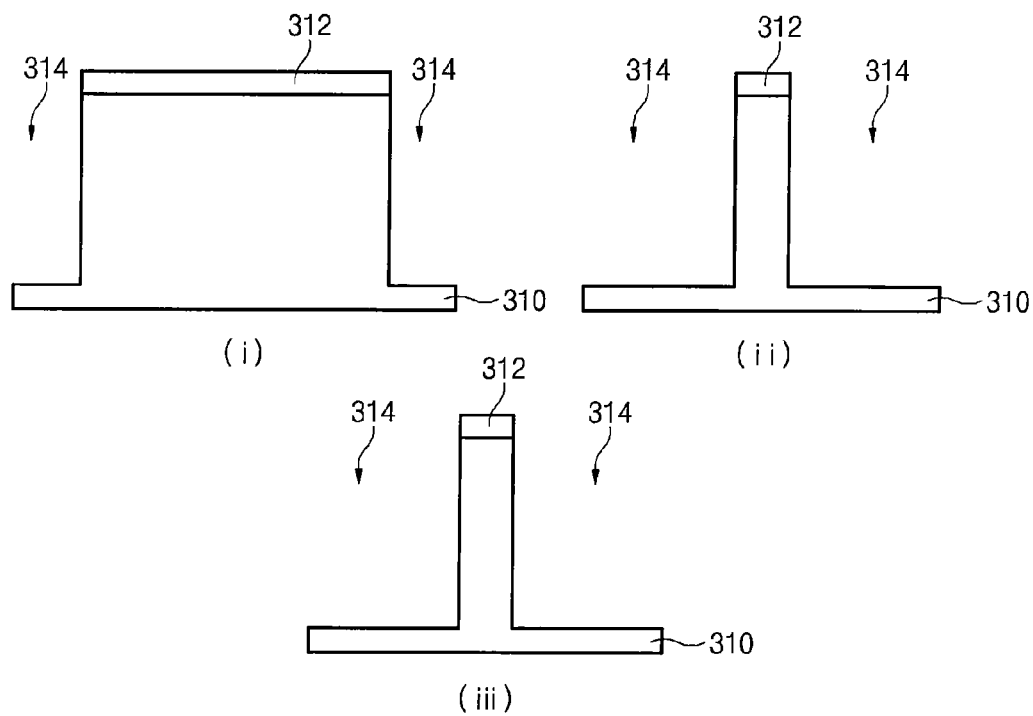
FIGS. 3a through 3h are cross-sectional views illustrating a method for fabricating a semiconductor device according to an embodiment of the invention.
Figure 3B:
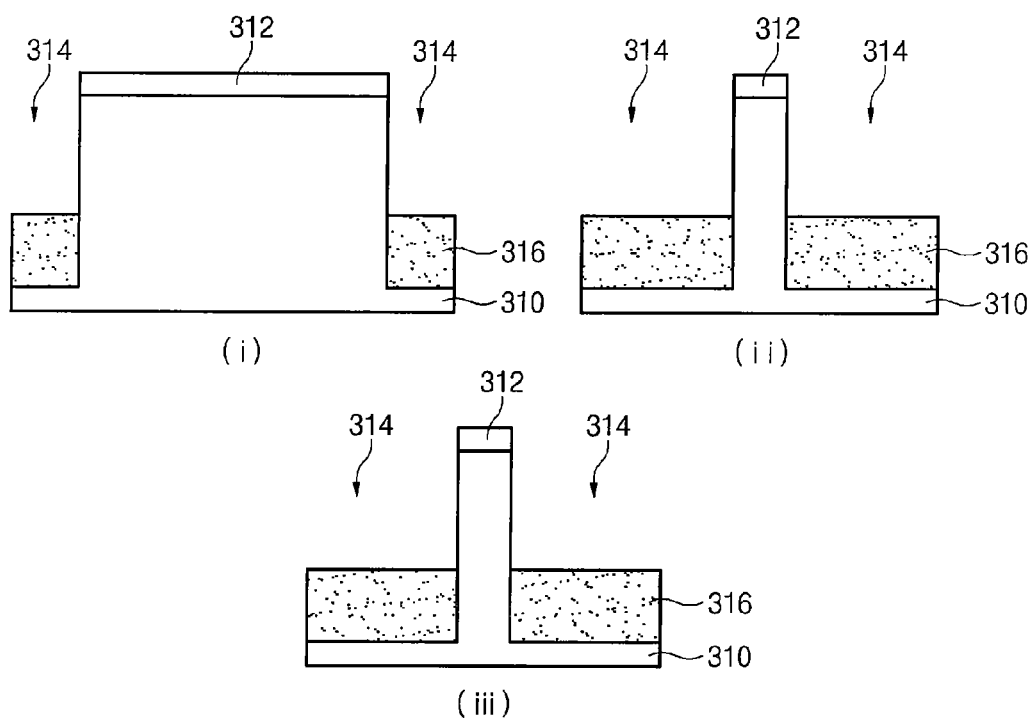

FIGS. 3a to 3h are cross-sectional views illustrating a method for fabricating a semiconductor device according to an embodiment of the invention. FIGS. 3a (i) to 3h (i) are cross-sectional views taken along I-I' of FIG. 1. FIGS. 3a (ii) to 3h (ii) are cross-sectional views taken along II-II' of FIG. 1. FIG. 3a (iii) to 3h (iii) are cross-sectional views taken along III-III' of FIG. 1.

A pad insulating film 312 is formed over a semiconductor substrate 310. A portion of pad insulating film 312 and semiconductor substrate 310 are selectively etched using a device isolation mask (not shown) as an etching mask, to form a trench 314 that defines active region 100 of FIG. 1. A first insulating film for device isolation 316 is formed to fill a portion of trench 314. In the vertical direction, a width of the device isolation mask becomes smaller so that a distance between neighboring active regions 100 becomes broader. As a result, a deposition margin of first insulating film for device isolation 316 can be increased.

Figure 3C:
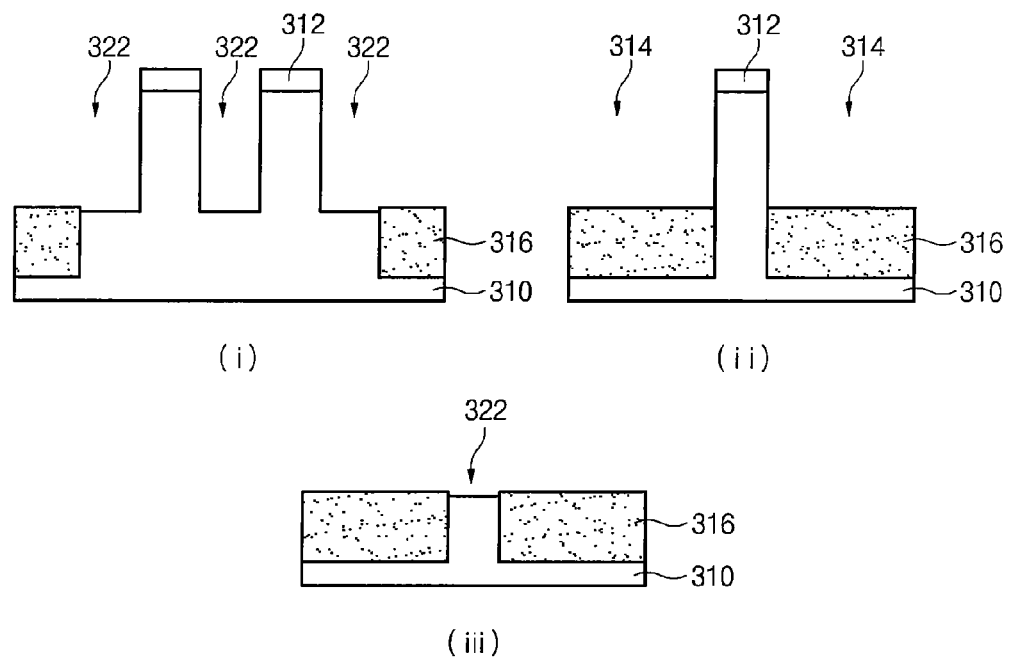
Figure 3D:
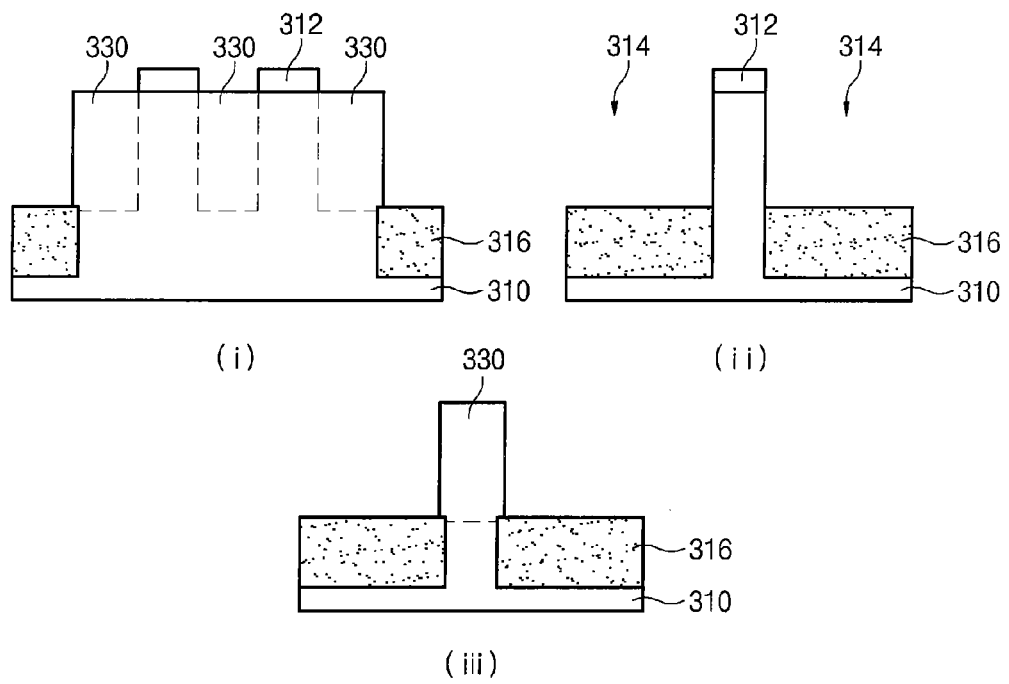

Referring to FIGS. 3c and 3d, pad insulating film 312 and a portion of underlying semiconductor substrate 310 in first active region 106 of FIG. 1 are selectively etched to form a recess 322. A selective epitaxial process is performed on a surface of semiconductor substrate 310 as a seed layer in the recess 322 to form a silicon epitaxial growth layer 330. Pad insulating film 312 is disposed over semiconductor substrate 310 in second active region 108 of FIG. 1, so that silicon epitaxial growth layer 330 is not formed in second active region 108. Silicon epitaxial growth layer 330 is grown toward the upper surface and the side surface of semiconductor substrate 310, so that, in the vertical direction, a width of first active region 106 may be substantially equal to the distance F between the two neighboring gates.

A depth of semiconductor substrate 310 exposed in recess 322 is in a range of about 10 to 100 nm. Silicon epitaxial growth layer 330 includes an undoped silicon layer. The selective epitaxial process for forming silicon epitaxial silicon growth layer 330 is performed by a thermal treatment process. The thermal treatment process is performed under a $H_2$ atmosphere at a temperature in a range of about 500° C. to 1,000° C. A plasma cleaning process including $SF_6/H_2$ is performed on the etched semiconductor substrate 310. The plasma cleaning process and the thermal treatment process are performed by an in-situ method.

In one embodiment, in the vertical direction, the line width of silicon epitaxial growth layer 330 is F, and the line width of semiconductor substrate 310 in second active region 108 is G (where 7F/20<G<19F/20 and F is a distance between the neighboring two gates).

Figure 3E:
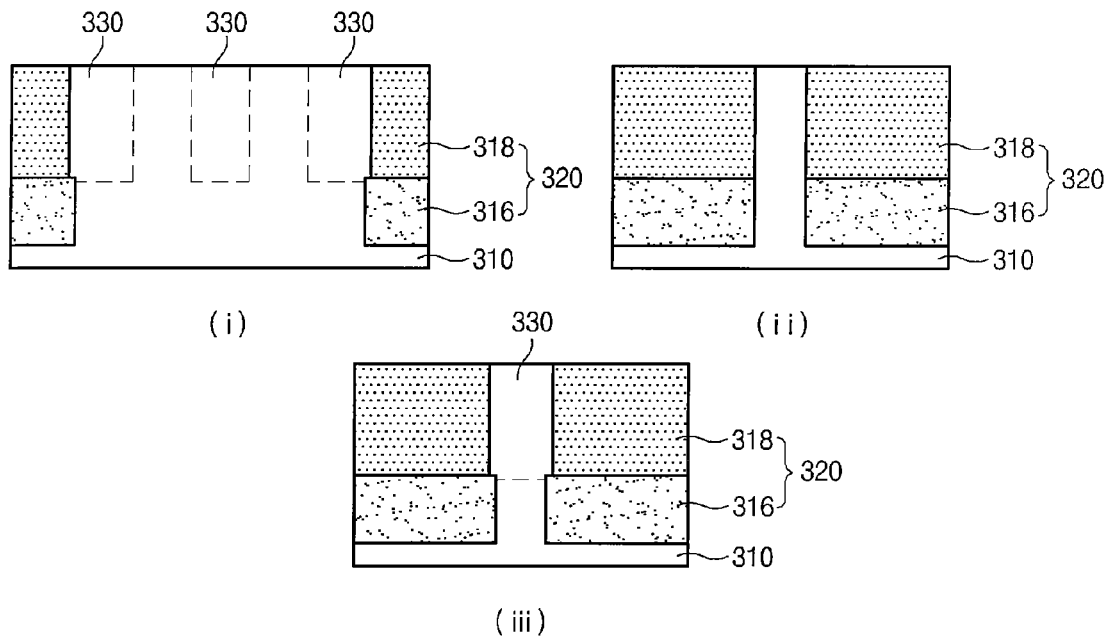

Referring to FIG. 3e, a second insulating film for device isolation 318 is formed over semiconductor substrate 310 to fill trench 314. Second insulating film for device isolation 318 is polished (or removed) until silicon epitaxial growth layer 330 is exposed, to form a device isolation structure 320. Device isolation structure 320 has a stacked structure including first insulating film for device isolation 316 and second insulating film for device isolation 318.

Figure 3F:
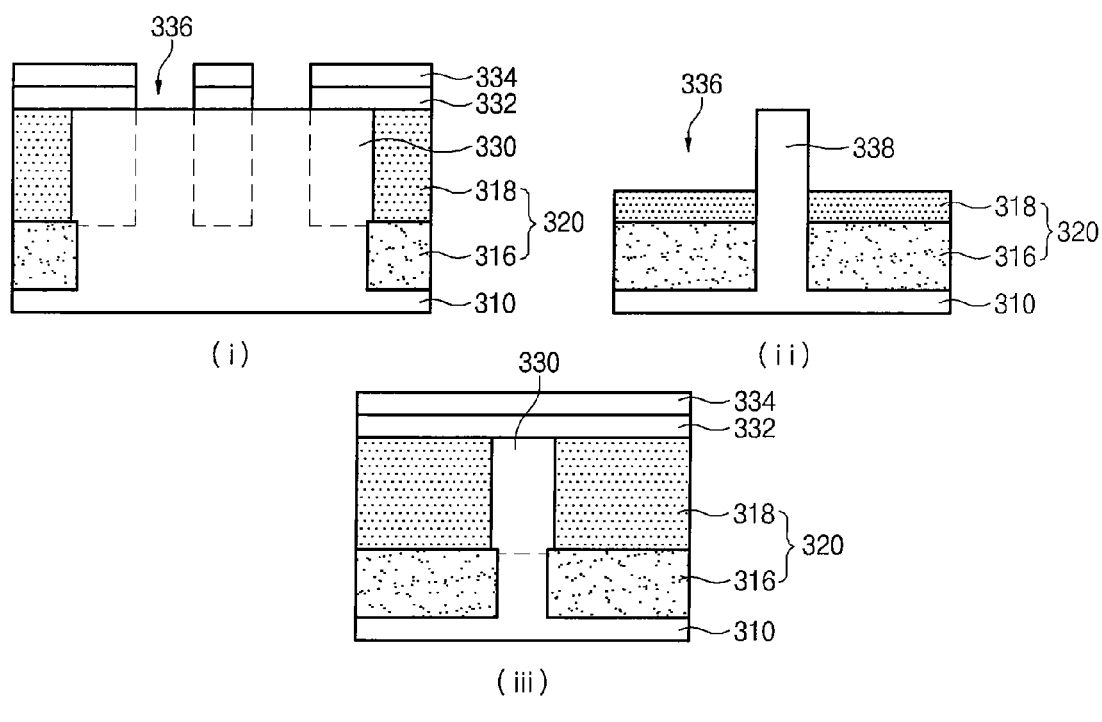

Referring to FIG. 3f, a hard mask layer 332 is formed over semiconductor substrate 310. A photoresist film (not shown) is formed over hard mask layer 332. The photoresist film is exposed and developed using a mask (not shown) that defines fin gate region 102 of FIG. 1, to form a photoresist pattern 334. Hard mask layer 332 and a portion of device isolation structure 320 are selectively etched using photoresist pattern 334 as a mask, to form a fin gate recess 336 that exposes a fin type active region 338.

Figure 3G:
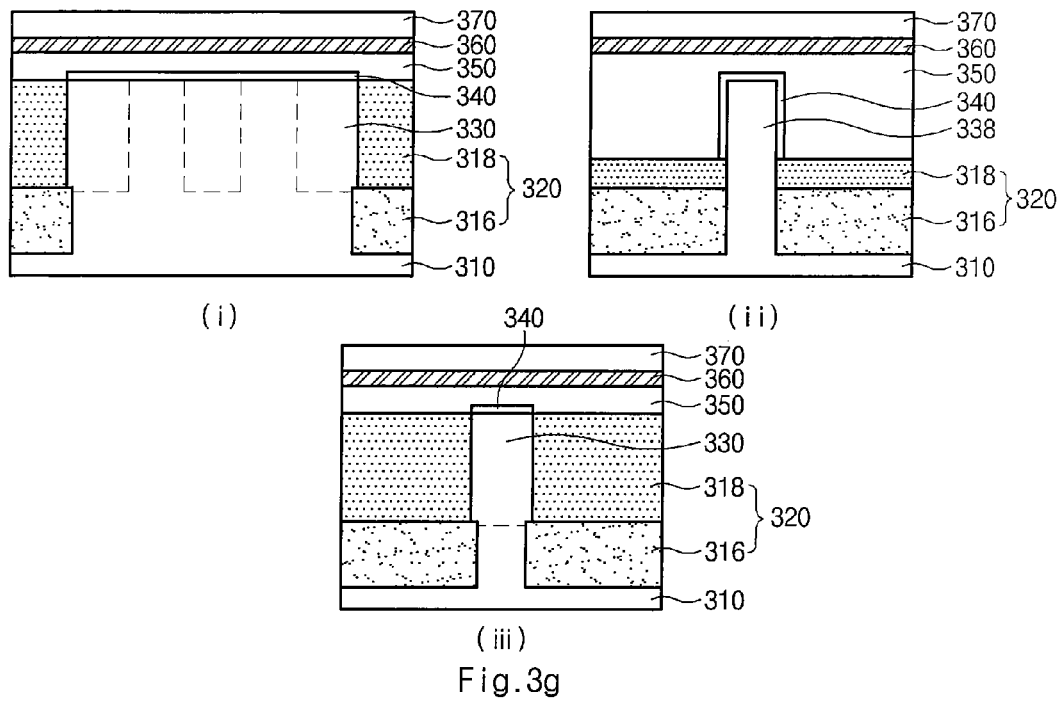
Figure 3H:
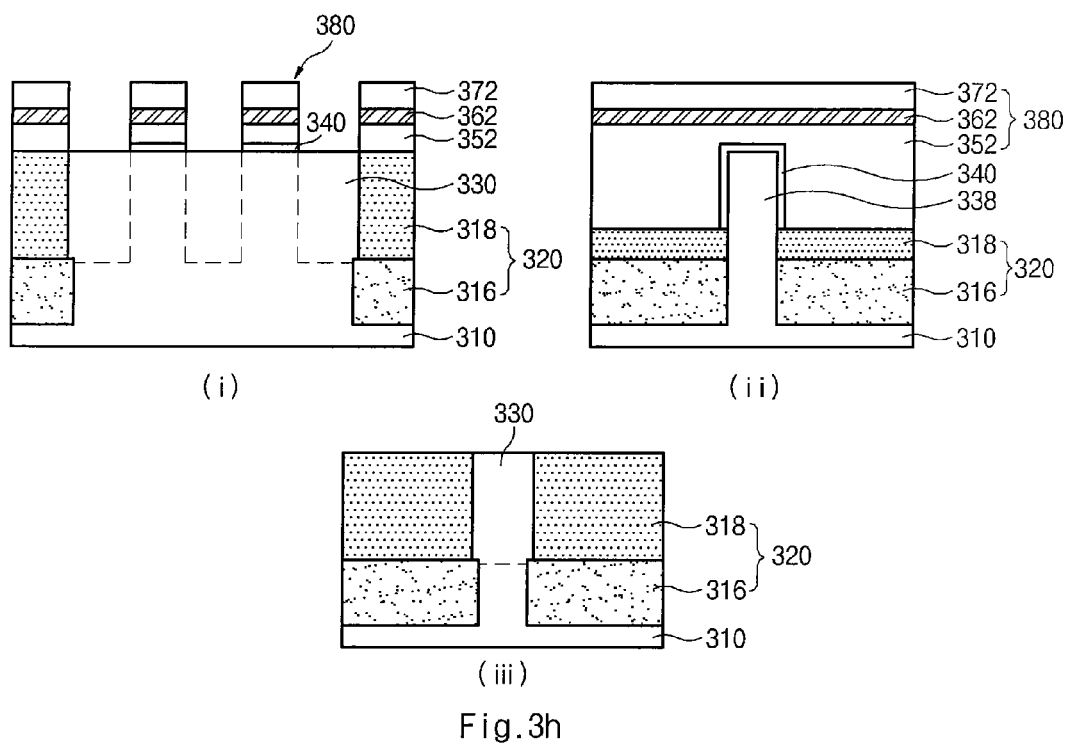

Referring to FIGS. 3g and 3h, hard mask layer 332 and photoresist pattern 334 are removed to expose semiconductor substrate 310 and a surface of fin type active region 338. A gate insulating film 340 is formed over semiconductor substrate 310 and a surface of fin type active region 338. A lower gate conductive layer 350 is formed over gate insulating film 340 to fill fin gate recess 336. An upper gate conductive layer 360 and a gate hard mask layer 370 are formed over lower gate conductive layer 350. Gate hard mask layer 370, upper gate conductive layer 360 and lower gate conductive layer 350 are patterned using a gate mask (not shown) to form a fin gate structure 380 having a stacked structure including a gate hard mask pattern 372, an upper gate electrode 362 and a lower gate electrode 352.

Figure 4:
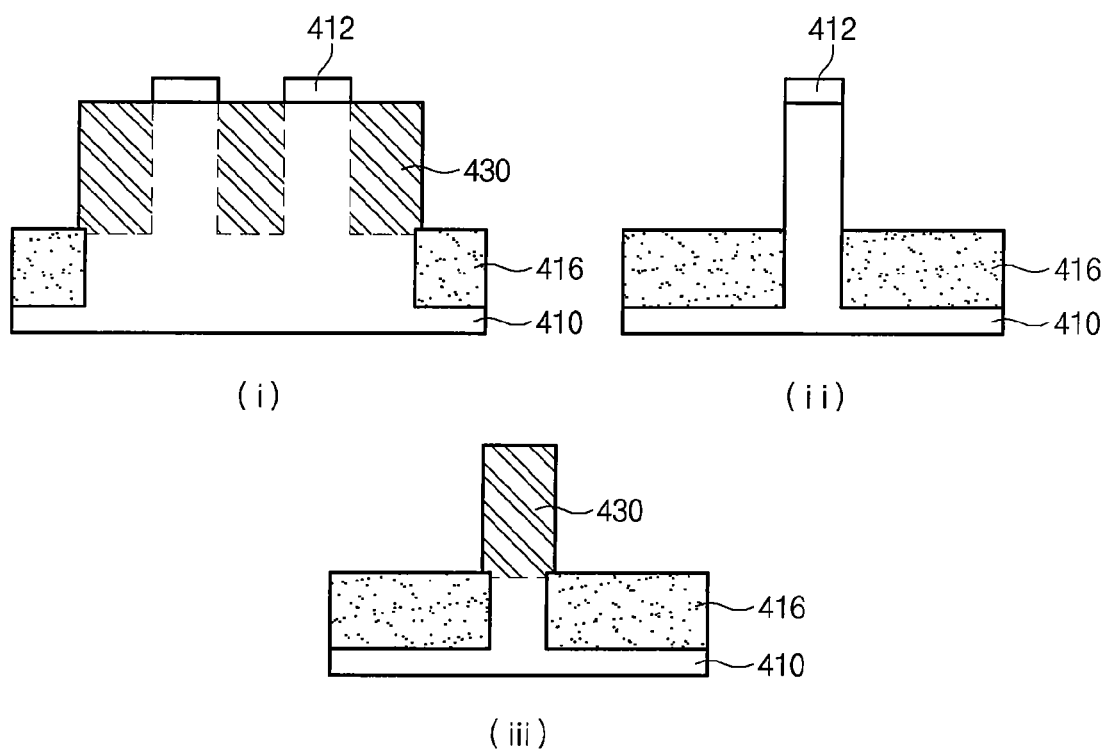
FIG. 4 is a cross-sectional view illustrating a method for fabricating a semiconductor device according to another embodiment of the invention.

FIG. 4 is a cross-sectional view illustrating a method for fabricating a semiconductor device according to an embodiment of the invention. A selective epitaxial process is performed on a semiconductor substrate 410 exposed in recess 322 of FIG. 3c as a seed layer, to form a silicon epitaxial growth layer 430. A pad insulating film 412 is disposed over semiconductor substrate 410 in second active region 108 of FIG. 1, so that silicon epitaxial growth layer 430 is not formed.

Silicon epitaxial growth layer 430 is formed of an impurity doped silicon layer. In one implementation, the impurity of silicon epitaxial growth layer 430 is selected from the group of consisting of B, $BF_2$, As, P, and combinations thereof. In other implementations, the impurity of silicon epitaxial growth layer 430 may be selected from other groups. Impurity doping concentration is in a range of about 1E18 ions/cm$^2$ to 5E20 ions/cm$^2$. The impurity doping concentration required for silicon epitaxial growth layer 430 is not limited.

As described above, in a semiconductor device and a method for fabricating the same according to an embodiment of the invention, a second active region (or source/drains) is formed of a silicon epitaxial growth layer. In the vertical direction, a line width of a second active region (or a gate region) is formed to be smaller than the width of a first active region, thereby improving short channel effects such as DIBL. In a device isolation structure, an initial interval between the active regions becomes broader to increase a gap-fill margin.

The above embodiments of the invention are illustrative and not limitative. Various alternatives and equivalents are possible. The invention is not limited by the type of deposition, etching polishing, and patterning steps described herein.

Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a semiconductor device, the method comprising:

forming first and second device isolation structures in a semiconductor substrate to define an active region including a first active area and a second active area, wherein the second active area is formed as a portion of a gate, and the first active area includes material epitaxially grown vertically and horizontally on the semiconductor substrate between two neighboring gate regions as a seed layer, wherein a line width of the first active area is greater than a line width of the second active area;

etching a portion of the device isolation structure overlapping the gate to form a recess; and forming the gate by filling the recess with conductive material.

2. The method of claim 1, wherein the step of forming the first active region comprises:

etching a portion of the semiconductor substrate to form a trench defining an active area;

forming a first insulating film for device isolation over the trench;

selectively etching a portion of the semiconductor substrate to define the first active area wherein a source/drain is to be formed;

performing a selective epitaxial process on the selectively etched semiconductor substrate as a seed layer to form the first active area; and forming a second insulating film to fill the trench to form a device isolation structure, wherein the gate has a fin structure.

3. The method of claim 2, wherein the recess is etched to a depth of about 10 nm to 100 nm.

4. The method of claim 2, wherein the selective epitaxial process is performed under a temperature in a range of about 500° C. to 950° C.

5. The method of claim 2, wherein the first active region is formed of an undoped silicon layer or an impurity doped silicon layer.

6. The method of claim 5, wherein the impurity is selected from the group of consisting of B, $BF_2$, As, P, and combinations thereof.

7. The method of claim 5, wherein a dosage of the impurity is in a range of about 1E18 ions/$cm^2$ to 5E20 ions/$cm^2$.

8. The method of claim 1, wherein in a longitudinal direction of the gate region, the line width of the first active area is F, and the line width of the second active area is G, where $7F/20 < G < 19F/20$ and F is a distance between the neighboring two gate lines.

9. A method of fabricating a semiconductor device having a fin gate, the method comprising:

forming first and second trenches on a semiconductor substrate to define a protruding portion between the first and second trenches;

etching a portion of the protruding portion to define first, second, and third recesses, the first recess being adjacent to the first trench, the second recess being adjacent to the second trench, the third recess being defined between the first and second recesses; and performing a selective epitaxial process on the semiconductor substrate to grow semiconductor material vertically and horizontally in the first, second, and third recesses to form a first active area.

10. The method of claim 9, further comprising:

forming a first insulation layer within the first and second trenches, the first insulation layer having an upper surface that is provided below an upper surface of the protruding portion.

11. The method of claim 10, wherein the semiconductor material grown by the epitaxial process extends partly over the first insulation layer provided at the first and second trenches.

12. The method of claim 11, wherein the protruding portion is used to define the fin gate.

* * * * *